(12) United States Patent
Dunn et al.

(10) Patent No.: US 11,074,131 B2
(45) Date of Patent: *Jul. 27, 2021

(54) STORAGE BACKED MEMORY PACKAGE SAVE TRIGGER

(71) Applicant: Micron Technology, Inc., Boise, ID (US)

(72) Inventors: James E. Dunn, Saint Paul, MN (US); Nathan A. Eckel, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/847,008

(22) Filed: Apr. 13, 2020

(65) Prior Publication Data

US 2020/0241963 A1   Jul. 30, 2020

Related U.S. Application Data

(63) Continuation of application No. 16/107,259, filed on Aug. 21, 2018, now Pat. No. 10,642,695.
(Continued)

(51) Int. Cl.
*G06F 11/14* (2006.01)
*G06F 13/42* (2006.01)
(Continued)

(52) U.S. Cl.
CPC ...... *G06F 11/1441* (2013.01); *G06F 11/1456* (2013.01); *G06F 13/4282* (2013.01);
(Continued)

(58) Field of Classification Search
CPC ............. G06F 11/1441; G06F 13/4282; G06F 11/1456; G06F 13/1668; G11C 5/148
See application file for complete search history.

(56) References Cited

U.S. PATENT DOCUMENTS 10,642,695 B2   5/2020  Dunn et al.
2010/0011155 A1  1/2010  Kitagawa
(Continued)

FOREIGN PATENT DOCUMENTS

CN   104798060   7/2015
CN   105531714   4/2016
(Continued)

OTHER PUBLICATIONS

Jedec. "DDR4 NVDIMM Standardization: Now and Future". Server Forum 2014. <https://www.jedec.org/sites/default/files/files/Brett_Williams_Server_Forum_2014.pdf>. (Year: 2014).*
(Continued)

*Primary Examiner* — Charles Rones
*Assistant Examiner* — Hewy H Li
(74) *Attorney, Agent, or Firm* — Schwegman Lundberg & Woessner, P.A.

(57) ABSTRACT

Devices and techniques for a storage backed memory package save trigger are disclosed herein. Data can be received via a first interface. The data is stored in a volatile portion of the memory package. Here, the memory package includes a second interface arranged to connect a host to a controller in the memory package. A reset signal can be received at the memory package via the first interface. The data stored in the volatile portion of the memory package can be saved to a non-volatile portion of the memory package in response to the reset signal.

15 Claims, 5 Drawing Sheets

Related U.S. Application Data

(60) Provisional application No. 62/627,988, filed on Feb. 8, 2018.

(51) Int. Cl.

| | | |
|---|---|---|
| *G11C 14/00* | (2006.01) | |
| *G11C 5/14* | (2006.01) | |
| *G11C 7/20* | (2006.01) | |
| *G11C 11/4072* | (2006.01) | |
| *G11C 11/406* | (2006.01) | |

(52) U.S. Cl.
CPC .............. *G11C 5/143* (2013.01); *G11C 5/148* (2013.01); *G11C 7/20* (2013.01); *G11C 11/4072* (2013.01); *G11C 11/40615* (2013.01); *G11C 14/0018* (2013.01)

(56) References Cited

U.S. PATENT DOCUMENTS

| | | | |
|---|---|---|---|
| 2010/0080057 | A1 | 4/2010 | Reuter et al. |
| 2013/0019076 | A1 | 1/2013 | Amidi et al. |
| 2013/0097369 | A1 | 4/2013 | Talagala et al. |
| 2013/0336047 | A1 | 12/2013 | Hokenmaier |
| 2014/0195718 | A1 | 7/2014 | Abraham et al. |
| 2015/0248935 | A1 | 9/2015 | Moshayedi et al. |
| 2016/0188414 | A1 | 6/2016 | Jayakumar et al. |
| 2019/0243713 | A1 | 8/2019 | Dunn et al. |

FOREIGN PATENT DOCUMENTS

| | | |
|---|---|---|
| CN | 111801735 | 10/2020 |
| TW | 201935252 A | 9/2019 |
| WO | WO-2019156853 A1 | 8/2019 |

OTHER PUBLICATIONS

"International Application Serial No. PCT/US2019/015625, International Search Report dated May 10, 2019", 4 pgs.

"International Application Serial No. PCT/US2019/015625, Written Opinion dated May 10, 2019", 5 pgs.

"TN-04-42: Memory Module Serial Presence-detect", [Online] Retrieved from the internet: <https://www.micron.com/-/media/client/global/documents/products/technical-note/dram-modules/tn_04_42.pdf>, (2002).

Chang, Jeff, et al., "NVDIMM-N Cookbook: A Soup-to-Nuts Primer on Using NVDIMM-Ns to Improve Your Storage Performance", Storage Networking Industry Association, [Online] Retrieved from the internet: <http://www.snia.org/sites/default/files/SDC15_presentations/persistant_mem/JeffChang-ArthurSainio_NVDIMM_Cookbook.pdf>, (2015).

"Taiwanese Application Serial No. 108104090, Office Action dated Jun. 17, 2020", w English Translation, 10 pgs.

"International Application Serial No. PCT US2019 015625, International Preliminary Report on Patentability dated Aug. 20, 2020", 7 pgs.

"Taiwanese Application Serial No. 108104090, Response filed Sep. 21, 2020 to Office Action dated Jun. 17, 2020", w English Claims, 37 pgs.

"Chinese Application Serial No. 201980016726.5, Office Action dated Mar. 11, 2021", w English translation, 9 pgs.

"European Application Serial No. 19752046.3, Response filed Mar. 25, 2021 to Communication pursuant to Rules 161(2) and 162 EPC dated Sep. 15, 2021", 11 pgs.

\* cited by examiner

STORAGE BACKED MEMORY PACKAGE SAVE TRIGGER

PRIORITY APPLICATION

This application is a continuation of U.S. application Ser. No. 16/107,259, filed Aug. 21, 2018, which claims the benefit of priority to U.S. Provisional Application Ser. No. 62/627,988, filed Feb. 8, 2018, all of which are incorporated herein by reference in their entirety.

TECHNICAL FIELD

The present disclosure generally relates to a memory sub-system, and more specifically, relates to a save trigger for a storage backed memory device.

BACKGROUND

Memory devices are typically provided as internal, semiconductor, integrated circuits in computers or other electronic devices. There are many different types of memory, including volatile and non-volatile memory. Memory devices store data for other components. Byte addressable memory devices can be directly used by processors or other components to store both current state data as well as data not directly connected to a current system state. Block addressable devices, such as hard disk drives, are storage devices that are generally not directly usable by system components to store state information. Often, a memory device serves as an intermediary, where block addressed data is loaded into the memory device before use by the system.

Volatile memory requires power to maintain its data, and includes random-access memory (RAM), dynamic random-access memory (DRAM), or synchronous dynamic random-access memory (SDRAM), among others. Volatile memory devices are widely deployed in computing systems. Generally, these devices are byte addressable and thus directly accessible from processors, unlike storage devices that are addressable in pages, blocks, etc. Volatile memories like SRAM and DRAM are also fast enough to satisfy user expectations for device performance.

While the power-dependent nature of volatile memories is not an issue under many circumstances, there are instances in which the loss of data, such as system state data, uncommitted transactions, etc., can be problematic. In these circumstances, losing power to the volatile memory can mean corrupted data or an inability to diagnose a problem because the evidence of the problem is lost when the volatile memory powers down. To address these instances, a variety of techniques have been tried. For example, battery backed RAMs use a secondary independent power source, a battery, to maintain the volatile memory contents in case the primary power source ceases to function. Battery backed RAMs had limited effectiveness due to the limited duration of the storage (e.g., when the battery could no longer provide power the contents were lost).

Non-volatile dual in-line memory modules (NVDIMMs) combine a popular volatile memory package family of standards (DIMMs) with non-volatile storage, such as NAND flash, to provide power-off retention of volatile memory contents for extended periods of time. The Joint Electron Device Engineering Council (JEDEC) has promulgated several standards pertaining to DIMMs, including Double Data Rate (DDR) memory interfaces and NVDIMMs that use DDR interfaces. NVDIMM-N is a family of JEDEC standards in which a DIMM includes flash storage and a controller in addition to DRAM or SRAM volatile memories. JEDEC standard 245B.01 (JESD245B.05) for Byte Addressable Energy Backed Interface (BAEBI) provides a number of implementation and interaction details with an example of a NVDIMM. As used herein, storage backed memory package refers to devices that integrate a non-volatile memory to preserve volatile memory data.

BRIEF DESCRIPTION OF THE DRAWINGS

The present disclosure is illustrated by way of example and not limitation in the figures of the accompanying drawings, in which like references indicate similar elements.

DETAILED DESCRIPTION

Figure 1:
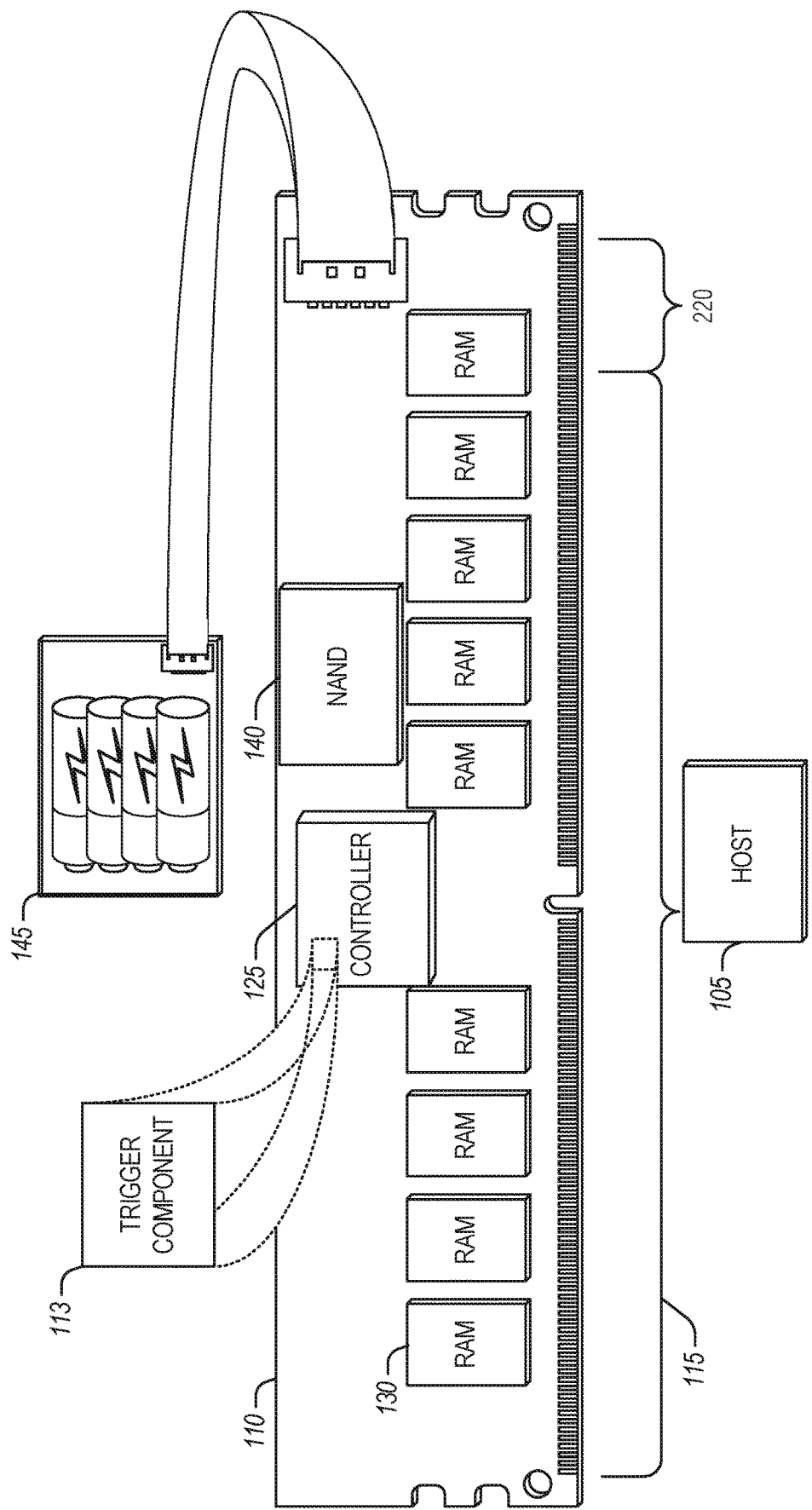
FIG. 1 illustrates an example of a NVDIMM to implement a save trigger, in accordance with some implementations of the present disclosure.

The following discussion is generally directed toward storage backed memory packages that conform to the NVDIMM-N family of standards. However, other storage backed memory packages can also benefit from the devices and techniques described below. As noted above, NVDIMM-N devices locate a NAND flash device on the module. A controller (e.g., processing device) is also included on the module. The controller is generally an application specific integrated circuit (ASIC), a field programmable gate array (FPGA), or other processing circuitry, arranged or programmed to manage data transfers between the DRAM or SDRAM volatile portion of the module to the flash non-volatile portion (e.g., the storage backing the DRAM or SDRAM memory). Often, the controller optimized for energy, space (e.g., die size), or process (e.g., using larger feature sizes) efficiency instead of computational speed. NVDIMM-N devices include two interfaces, a DDR version 4 (DDR4) memory interface to enable a host (e.g., processor) to use the module for system memory, and an Inter-Integrated Circuit (I2C, I²C, or IIC) bus to enable the host to communicate directly to the controller.

I2C is a packet switched bus that uses a two-wire connection (e.g., one wire for the clock signal and one wire for the data signal). Thus, I2C provides a flexible and efficient addition to many discrete integrated circuits within a system. However, I2C is quite slow when compared to the DDR4 memory interface, with I2C having either a 100 or 400 kilobits (Kbits) per second throughput and DDR4 having data rates between 1,600-3,200 megabits (Mbits) per second throughput. Host communication with the controller over I2C generally involves reading and writing registers of the controller. For example, a host can issue a partial save command to the controller by setting beginning and end address registers and actuating a save register via I2C.

An issue arises in the confluence of NVDIMM save functionality and the slow and possibly high-latency characteristics of the I2C bus or other host to controller interfaces. Previous non-storage backed memory packages implemented a similar pin interface (e.g., a 288 pin JEDEC DIMM interface for DDR4) in which some pins were reserved (e.g., not used). The newer storage backed memory packages use some of these reserved pins to enable the fast and low-latency memory interface (e.g., DDR) to invoke storage operations such as a save. However, older physical host interfaces (e.g., memory sockets in motherboards) often did not connect (e.g., wire, enable, etc.) the reserved pins and thus cannot implement the storage backed functionality of storage backed memory packages using the memory interface. Although the host to controller interface can be used, the limited time from host power failure to loss of an ability by the host to signal the save, for example, causes the slower host to controller interface to be unreliable. This limited time also causes problems if the storage backed memory package simply triggers off its own lack of power from the host, resulting in possible data corruption. Further, in uses cases where there is no power loss, yet retention of volatile memory data is valuable (e.g., to assess a software error via the RAM state after a warm restart), this last technique does not work because there is no loss of power.

Aspects of the present disclosure are directed to a save trigger in a storage backed memory, or memory sub-system (e.g., "memory device"). An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

Thus, to address the issue of using the memory interface in host hardware that does not support storage backed functionality pins, the storage backed memory package can use signaling on available pins that does not interfere with memory functions to trigger the storage backed functions. For example, assuming that a physical host interface does not have a connection to the SAVE_n pin of the storage backed memory package as specified in the JEDEC BAEBI family of standards. The controller can trigger the operation corresponding to the SAVE_n pin signal off of a signal on the RESET_n pin. While saving the volatile contents each time a reset is signaled probably does not interfere with the memory operations because the reset is still performed, it can lead to undue wear on the non-volatile portion of the storage backed memory package, or unnecessarily consume power. Thus, in an example, a predicate—such as putting the storage backed memory package into self-refresh mode—in which the RESET_n register is traditionally disabled, signals a clear distinction to the controller between an intended reset operation and a save operation using the RESET_n pin. Additional details and examples are described below.

FIG. 1 illustrates an example of a NVDIMM 110 to implement a save trigger, according to an embodiment. In an example, the NVDIMM 110 conforms to a JEDEC NVDIMM-N family of standards. The NVDIMM 110 includes a controller 125, a volatile storage portion 130, a non-volatile storage portion 140, a first interface (e.g., a DDR interface), and a second interface (e.g., an I2C bus). The volatile portion 130 includes one or more DRAM or SRAM integrated circuits (ICs) to store data for read or write operations of the host 105 via the first interface. The non-volatile storage portion 140 can be implemented in any storage technology that does not require power in order to maintain state. Example non-volatile storage technologies can include NAND flash, NOR flash, storage class memory (e.g., phase change memory), magnetic storage, and the like.

As illustrated, the first interface is split between a legacy portion 115 and new portion 220. These portions can represent pins, or other discreet physical connections, that physically embody the first interface. The new portion 220 represents pins that are specified in a memory interface that did not have a purpose. These pins of the new portion pins, however, are used to implement the storage backed functionality of the NVDIMM 110. As noted above, many mother boards, or other physical interfaces of the host 105, do not have connections to the new portion 220. Thus, these physical interfaces of the host 105 cannot use the new portion 220 of the first interface to use the storage backed functionality, such as saving the volatile portion 130 contents to the non-volatile portion 140.

The second interface is generally used by the host 105 to communicate directly with the controller 125 to perform a variety of operations. The controller 125 is arranged to implement these operations within the NVDIMM 110. The controller 125 is implemented as electronic hardware, such as an FPGA, ASIC, digital signal processor (DSP), or other processing circuitry, such as an example of the trigger component 113 illustrated here. In an example, the controller executes instructions (e.g., firmware) on the electronic hardware to perform the operations. This is another example of the trigger component 113 illustrated in FIG. 5. The BAEBI family of standards define a number of operations implemented by compliant devices.

When the second interface is an I2C bus, typical communications involve the host 105 setting registers in the controller 125 via the second interface. For example, the host 105 can set a specific register such that a specific bit in that register is changed from a zero into a one. When this bit value change corresponds to execution of a command, the controller 125 performs the command in response to the bit modification. If the command has arguments, the host 105 can set the registers corresponding to the arguments. In this case, the controller 125 is arranged to check these argument registers to retrieve the data to complete the command. This communication paradigm introduces latency in the second interface communications between the host 105 and the controller 125. Thus, although the second interface can be used to initiate several storage backed commands of the NVDIMM 110, the second interface might not be fast enough during host power failure to prevent data corruption during these commands.

To implement the save trigger using the first interface, the controller 125 is arranged to enable the legacy portion 115 of the first interface to stand-in for a signal of the new portion 220. Thus, the controller 125 is arranged to receive data to store in the volatile portion 130 via the first interface, as would occur in a traditional memory operation with a memory package. Here, the legacy portion 115 is used for the data receipt as the new portion 220 is not functional.

The controller 125 is arranged to receive a reset (or other) signal via the legacy portion 115 of the first interface. In an example, the reset signal is received at pin corresponding to RESET_n as defined in the JEDEC standards for DDR4. In an example, the pin corresponding to RESET_n is pin 94 of 288. Although the reset signal is used in these examples as an alternate to a dedicated save signal from the new portion 220 of the first interface, other signals can be used.

The controller 125 is arranged to save the data stored in the volatile portion 130 to the non-volatile portion 145 in response to the reset signal. The RESET_n pin provides a useful integration point as the reset operation (e.g., clearing the volatile portion) can be carried out after the data is moved from the volatile portion 130 to the non-volatile portion 140. Thus, the memory functionality of the NVDIMM 110 appears to function as expected by the host 105 while allowing the host access to the non-volatile portion 140 data via the second interface.

In an example, saving the data stored in the volatile portion of the memory package to a non-volatile portion of the memory package is performed in response to a self-refresh mode being enabled at the time of the reset signal. Using the self-refresh mode predicate to the refresh signal provides additional flexibility in discriminating between an alternative "save" command via the first interface and causing a traditional first interface command to perform double duty; its traditional operation plus the "save" of storage backed memory packages. In this circumstance, the reset operation is traditionally disabled (e.g., the RESET_n pin value is ignored) by the controller 125 when in self-refresh mode. Thus, when the controller 125 observes host 105 signaling on the RESET_n pin (e.g., bring the voltage from high to low), the controller 125 is unambiguously signaled that the host 105 is invoking the save command.

In an example, the controller 125 is arranged to perform the data save (e.g., from the volatile portion 130 to the non-volatile portion 140) in response to the reset signal only when the controller 125 determines that a dedicated save signal (e.g., in the new portion 220) is inoperative. Thus, the controller 125 performs a test of the new portion 220 (e.g., testing whether the voltage on a save pin is high) before accepting the alternate save command. This testing can eliminate possible command collisions, or side-effects, when a host 105 physical interface implemented the new portion 220. In an example, the dedicated save signal is communicated by a pin corresponding to SAVE_n as defined the JEDEC family of standards for DDR4. In an example, the pin corresponding to SAVE_n is pin 230 of 288.

The NVDIMM 110 can optionally include a power source 150 separate from host power. The power source 150 can be incorporated into the NVDIMM package, or connected to the NVDIMM package (as illustrated). The power source 150 can provide power to enable the controller 125 to move data from the volatile portion 130 to the non-volatile portion 145 in case of host power failure.

The controller 125 described above addresses enabling storage backed memory functionality in host 105 physical interfaces that do not support new portion 220 signals in the first interface without falling back on the problematic second interface. The controller 125 enables legacy hardware—such as can be found in many data centers or other use cases as described below with respect to FIG. 2—to reap the benefits of storage backed memory without costly upgrades.

Figure 2:
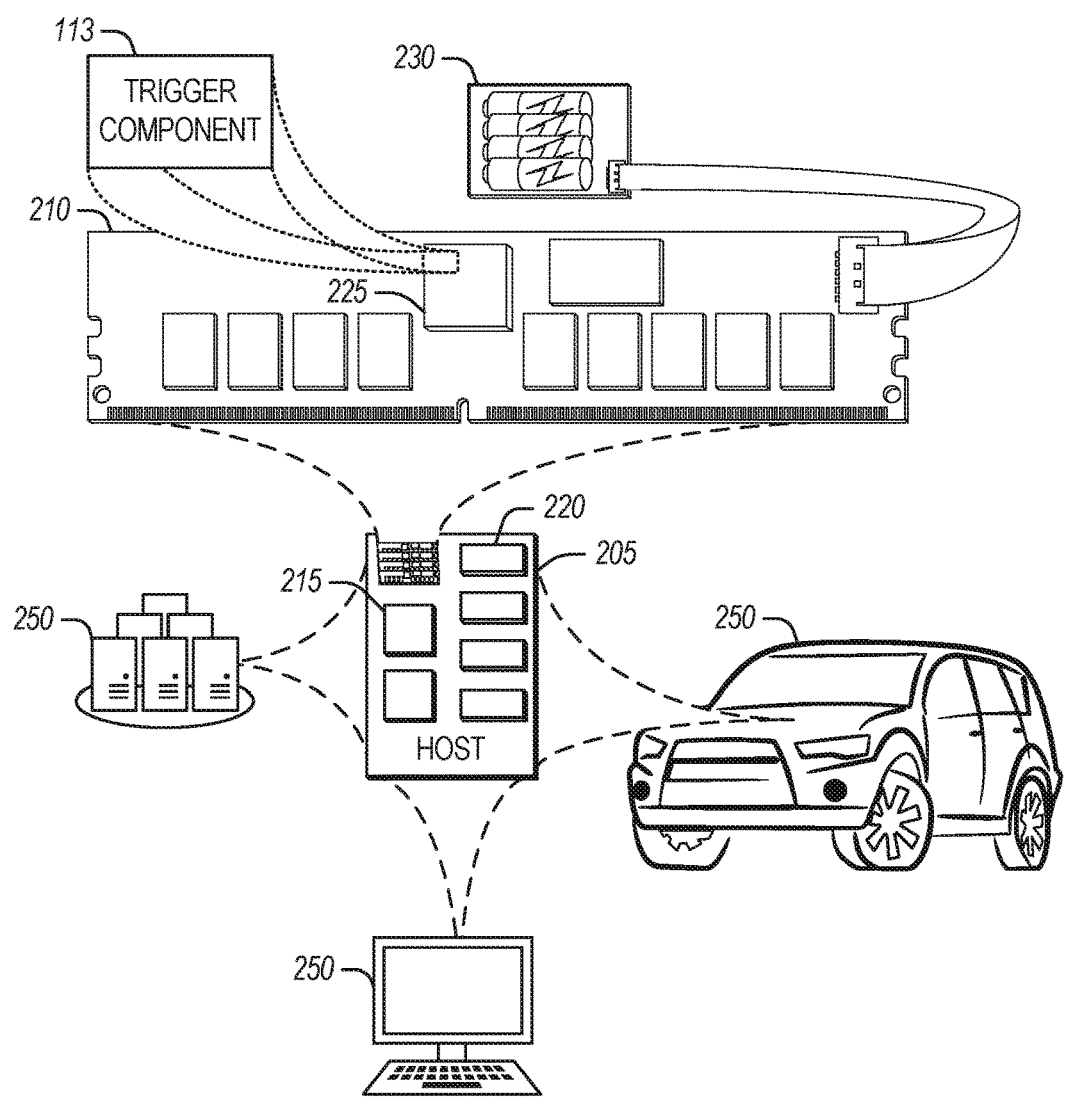
FIG. 2 illustrates an example of an environment including a system for a storage backed memory package save trigger, in accordance with some implementations of the present disclosure.

FIG. 2 illustrates an example of an environment 200 including a system (e.g., storage backed memory 210) for a storage backed memory package save trigger, according to an embodiment. The environment 200 includes a host device 205 and the storage backed memory package 210. The host device 205 or the storage backed memory package 210 can be included in a variety of products 250, such as data center servers, personal computers, or Internet of Things (IoT) devices (e.g., a refrigerator or other appliance, sensor, motor or actuator, mobile communication device, automobile, drone, etc.) to support processing, communications, or control of the product 250. The system can be the storage backed memory package 210, or a component of the storage backed memory package 210 such as the on-package controller 225. The system can also include a memory controller 220 or a processor 215 of the host device 205.

One or more communication interfaces can be used to transfer data between the storage backed memory package 210 and one or more other components of the host device 205, such as the processor 215. In an example, DDR4 is an implemented communication interface. In an example, I2C is an implemented communication interface. The host device 205 can include a host system, an electronic device, a memory card reader, or one or more other electronic devices external to the storage backed memory package 210. In some examples, the host 205 can be a machine having some portion, or all, of the components discussed in reference to the machine 500 of FIG. 5.

The processor 215 (which can be referred to as the host) generally directs or coordinates the activities of the host device 205 and the included components. The memory controller 220 supports memory activities, including use of the storage backed memory package 210, by components of the host device 205. The memory controller 220 can provide data addressing, and command coordination to the storage backed memory package 210. These activities can include data transfers to (e.g., write or erase) or from (e.g., read) one or more of the chips, ranks, or banks of the volatile portions of the storage backed memory package 210. The memory controller 215 can include, among other things, circuitry or firmware, including one or more components or integrated circuits. For example, the memory controller 215 can include one or more memory control units, circuits, or components configured to control access across the storage backed memory package 210 and to provide a translation layer between the host 205 and the storage backed memory package 210. The memory controller 215 can include one or more input/output (I/O) circuits, lines, or interfaces to transfer data to or from the storage backed memory package 210.

The memory controller 215 can include, among other things, circuitry or firmware, such as a number of components or integrated circuits associated with various memory management functions, such as de-fragmentation, or the save trigger techniques described herein (e.g., trigger component 113). The memory controller 215 can parse or format host commands (e.g., commands received from a host) into device commands (e.g., commands associated with operation of a memory array, etc.), or generate device commands (e.g., to accomplish various memory management functions) for the storage backed memory package 210 or one or more other components of the storage backed memory package 210.

The memory controller 215 can include, among other things, circuitry or components configured to control memory operations associated with writing data to, reading data from, or erasing one or more memory cells of the storage backed memory package 210. The memory operations can be based on, for example, host commands received from the host 205, or internally generated by the memory controller 215 (e.g., in association with defragmentation, error correction, refresh, etc.). The memory controller 215 can include code or logic to communicate using a standardized protocol (or features from a standardized protocol), such as GDDR6.

The storage backed memory package 210 can include the on-package controller 225 in addition to a volatile memory (e.g., DRAM or SRAM) and a non-volatile portion (e.g., flash). The storage backed memory package 210 can also include an on-board power source, or external power source 230, such as an electric double-layer capacitor (e.g., ELDC, supercapacitor, supercap, ultracapacitor, ultracap, etc.), battery, etc. The power source 230 can be independent of other host power sources and enable the on-package controller 225 to transfer data from volatile portions of the storage backed memory package 210 to non-volatile portions of the storage backed memory package 210 when host power fails. The on-package controller 225 can also move data from the non-volatile portions to the volatile portions (e.g., upon host power recovery) or provide access to the non-volatile portions directly. This last ability can enable greater error analysis during a host crash, for example, than is possible with standard system memory devices.

Figure 3:
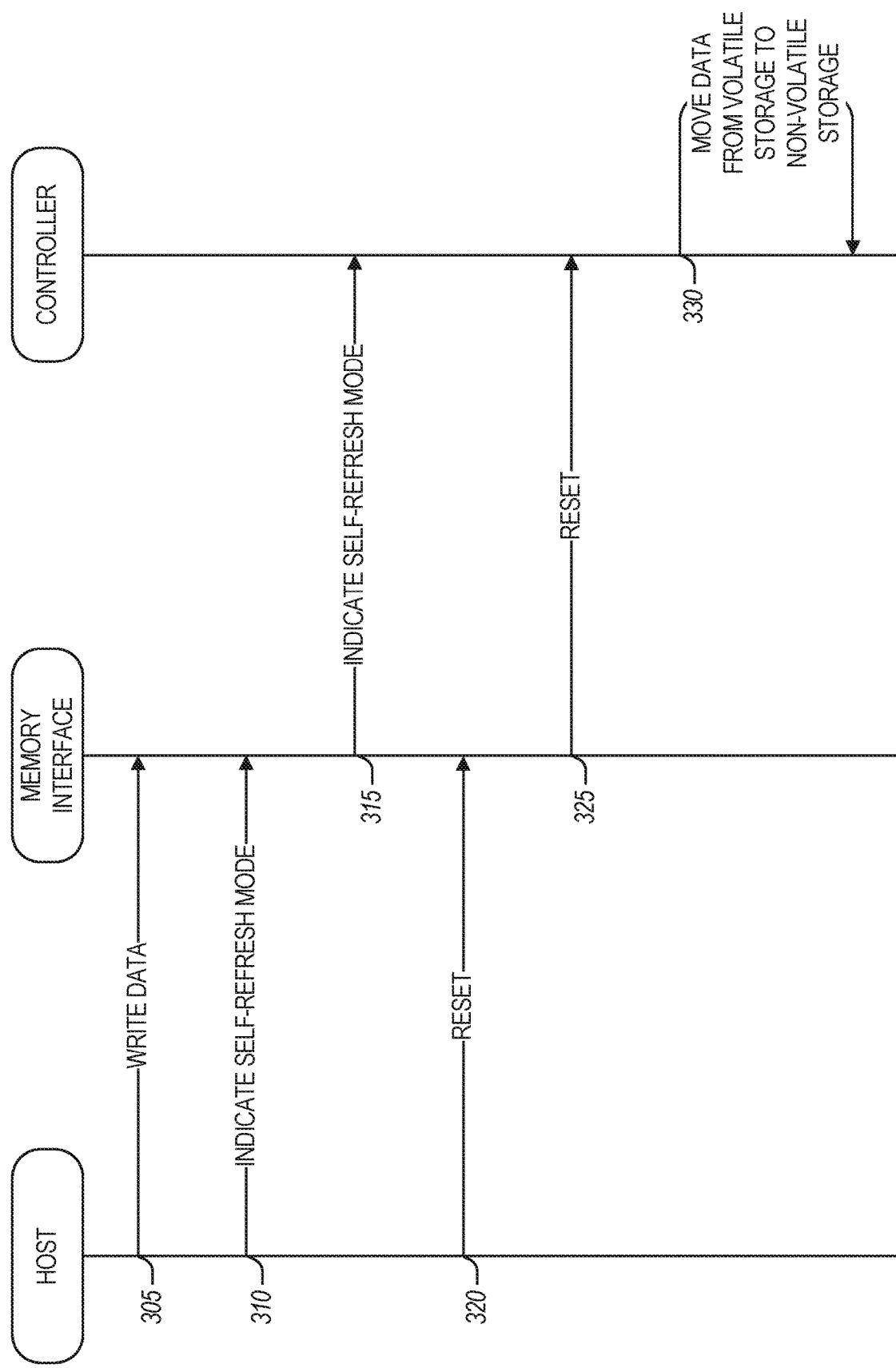
FIG. 3 illustrates an example component messaging to implement a storage backed memory package save trigger, in accordance with some implementations of the present disclosure.

FIG. 3 illustrates an example component messaging to implement a storage backed memory package save trigger, according to an embodiment. The illustrated HOST, MEMORY INTERFACE (e.g., DDR), and CONTROLLER components are similar to those described above. In an example, the MEMORY INTERFACE is an interface of the CONTROLLER. In this example, the illustrated message flows distinguish between the MEMORY INTERFACE portion of the CONTROLLER and other portions of the CONTROLLER, such as those executing firmware to perform other actions.

Figure 4:
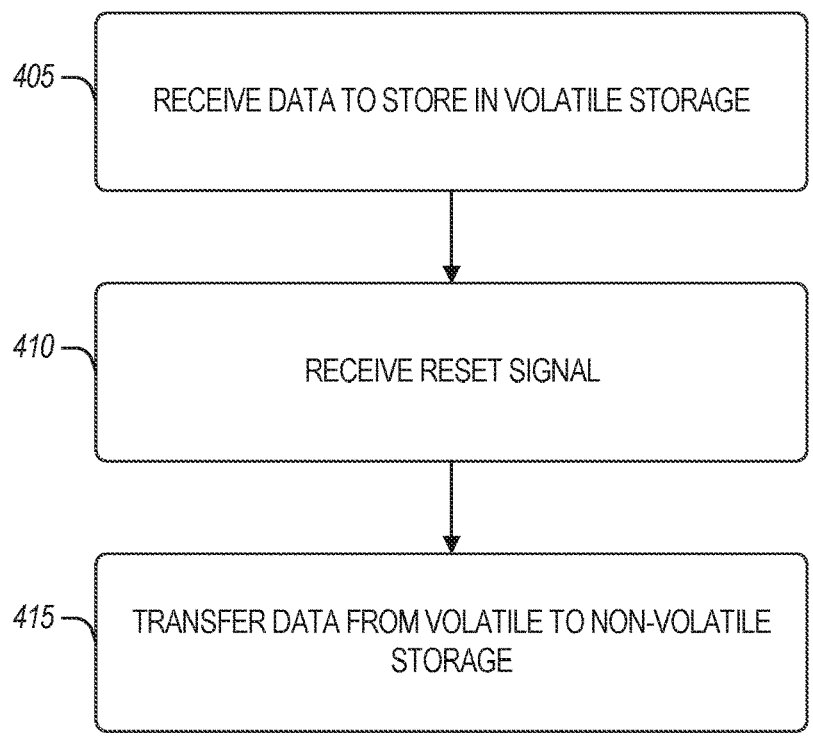
FIG. 4 illustrates an example flowchart of a method for a storage backed memory package save trigger, in accordance with some implementations of the present disclosure.

The message flow illustrated in FIG. 4 uses the reset signal as an alternate for the save signal when the HOST physical interface to the MEMORY interface does not implement the save signal. The HOST writes data (message 305) to the MEMORY INTERFACE to store in the storage backed memory package. To perform a save on this data, the HOST then puts the storage backed memory device into a self-refresh mode by signaling the MEMORY INTERFACE (message 310), which then provokes the MEMORY INTERFACE to relay the command to the CONTROLLER (message 315).

After signaling the storage backed memory package to enter the self-refresh mode, the HOST signals a reset to the storage backed memory package via the MEMORY INTERFACE (message 320). This, in turn, is communicated to the CONTROLLER (message 325). This combination of signals is interpreted by the CONTROLLER in the same way that the save signal would have been interpreted and the CONTROLLER performs the save by moving data from a volatile portion to a non-volatile portion of the storage backed memory package (operation 330.

FIG. 4 illustrates an example flowchart of a method 400 for a storage backed memory package save trigger, according to an embodiment, according to an embodiment. The operations of the method 400 are can be implemented in electronic hardware, such as that described above with respect to FIGS. 1-2 and below with respect to FIG. 5 (e.g., in circuitry).

At operation 405, data to store in a volatile portion of a memory package is received via a first interface. In an example, the memory package includes a second interface arranged to connect a host (e.g., the host 105) to a controller (e.g., the controller 125) in the memory package. In an example, the memory package operates in accordance with a JEDEC BAEBI family of standards. In an example, the JEDEC BAEBI family of standards include a JESD245B.01 standard. In an example, the second interface is a bus that operates in accordance with an I2C family of standards. In an example, the first interface is a DDR4 RAM interface. In an example, the memory package conforms to a NVDIMM. In an example, the NVDIMM is a NVDIMM-N type in accordance with the JEDEC.

At operation 420, a reset signal is received at the memory package via the first interface. In an example, the reset signal is received at pin corresponding to RESET_n as defined in the JEDEC standards for DDR4.

At operation 415, the data stored in the volatile portion of the memory package is saved to a non-volatile portion of the memory package in response to the reset signal. In an example, saving the data stored in the volatile portion of the memory package to a non-volatile portion of the memory package is performed in response to a self-refresh mode of the memory package being enabled at the time of the reset signal.

In an example, the data stored in the volatile portion of the memory package is saved to a non-volatile portion of the memory package when a determination that a dedicated save signal is inoperative. In an example, the pin corresponding to RESET_n is pin 94 of 288. In an example, the dedicated save signal is communicated by a pin corresponding to SAVE_n as defined the JEDEC family of standards for DDR4. In an example, the pin corresponding to SAVE_n is pin 230 of 288.

Figure 5:
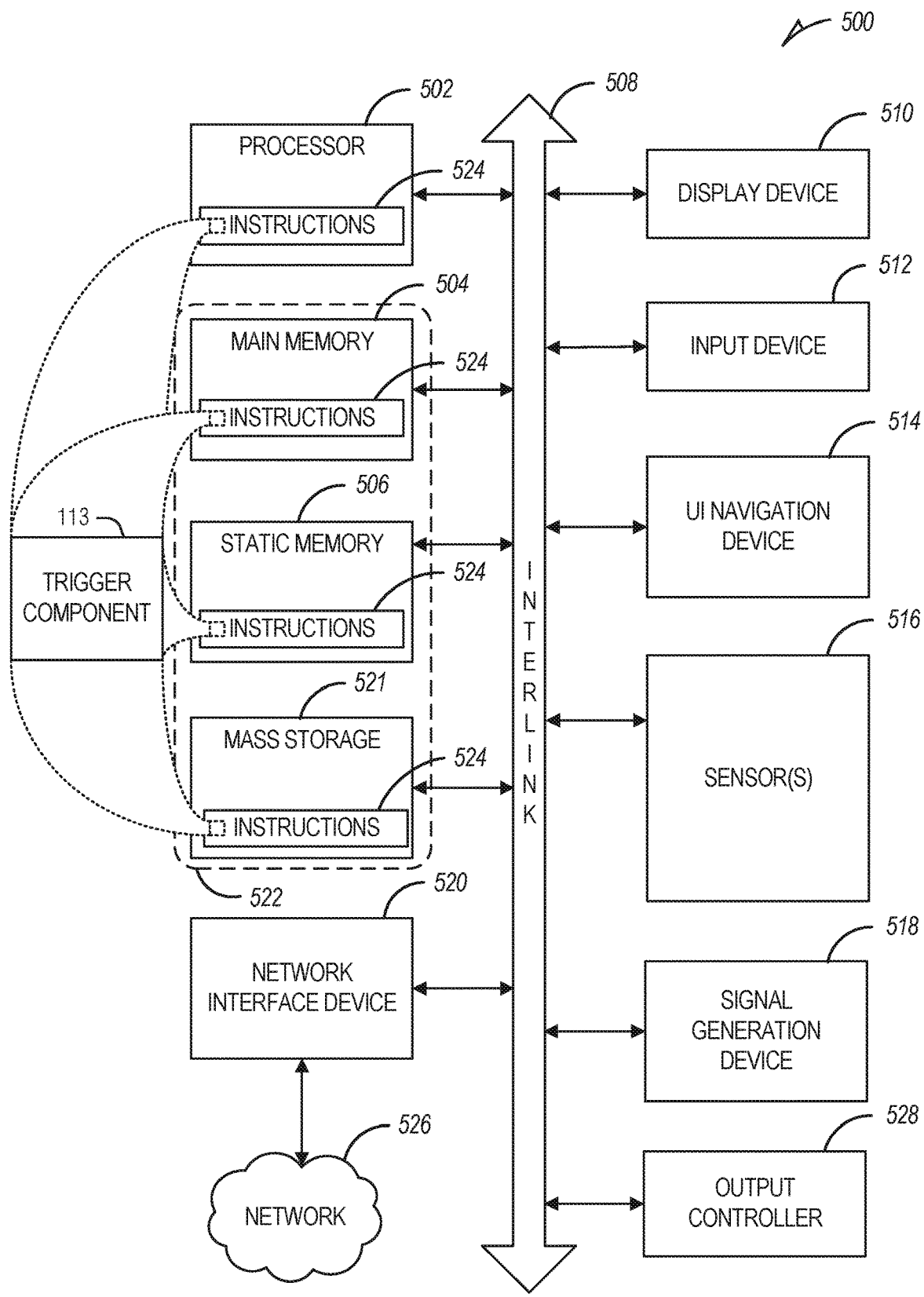
FIG. 5 is a block diagram illustrates an example computer system within which a set of instructions may be executed for causing the machine to perform any one or more of the methodologies discussed herein, according to implementations of the present disclosure.

FIG. 5 illustrates a block diagram of an example machine 500 upon which any one or more of the techniques (e.g., methodologies) discussed herein can perform. In alternative embodiments, the machine 500 can operate as a standalone device or can be connected (e.g., networked) to other machines. In a networked deployment, the machine 500 can operate in the capacity of a server machine, a client machine, or both in server-client network environments. In an example, the machine 500 can act as a peer machine in peer-to-peer (P2P) (or other distributed) network environment. The machine 500 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms. Circuitry (e.g., a circuit set, processing circuitry, etc.) is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system) 500 can include a hardware processor 502 (e.g., a CPU, a GPU, a hardware processor core, or any combination thereof), a main memory 504 and a static memory 506, some or all of which can communicate with each other via an interlink (e.g., bus) 508. The machine 500 can further include a display unit 510, an alphanumeric input device 512 (e.g., a keyboard), and a user interface (UI) navigation device 514 (e.g., a mouse). In an example, the display unit 510, input device 512, and UI navigation device 514 can be a touch screen display. The machine 500 can additionally include a signal generation device 518 (e.g., a speaker), a network interface device 520, and one or more sensors 516, such as a global positioning system (GPS) sensor, compass, accelerometer, or other sensor. The machine 500 can include an output controller 528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The machine 500 can include one or more machine readable medium 522 on which is stored one or more sets of data structures or instructions 524 (e.g., software) embodying or utilized by any one or more of the techniques or functions described herein, such as the trigger component 113. The machine readable medium 522 can include one or more of: main memory 524, static memory 506, and mass storage 521. The instructions 524 can reside, completely or at least partially, within the main memory 504, within static memory 506, mass storage 521 or within the hardware processor 502 during execution thereof by the machine 500. In an example, one or any combination of the hardware processor 502, the main memory 504, the static memory 506, or the mass storage 521 can constitute the machine readable medium 522.

While the machine readable medium 522 is illustrated as a single medium, the term "machine readable medium" can include a single medium or multiple media (e.g., a centralized or distributed database, or associated caches and servers) configured to store the one or more instructions 524.

The term "machine readable medium" can include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine readable medium examples can include solid-state memories, optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media can include: non-volatile memory, such as semiconductor memory devices (e.g., EPROM, EEPROM) and flash memory devices; magnetic disks, such as internal hard disks and removable disks; magneto-optical disks; and CD-ROM and DVD-ROM disks.

The instructions 524 (e.g., software, programs, an operating system (OS), etc.) or other data are stored on the mass storage 521, can be accessed by the memory 504 for use by the processor 502. The memory 504 (e.g., DRAM) is typically fast, but volatile, and thus a different type of storage than the mass storage 521 (e.g., an SSD), which is suitable for long-term storage, including while in an "off" condition. The instructions 524 or data in use by a user or the machine 500 are typically loaded in the memory 504 for use by the processor 502. When the memory 504 is full, virtual space from the mass storage 521 can be allocated to supplement the memory 504; however, because the mass storage 521 device is typically slower than the memory 504, and write speeds are typically at least twice as slow as read speeds, use of virtual memory can greatly reduce user experience due to storage device latency (in contrast to the memory 504, e.g., DRAM). Further, use of the mass storage 521 for virtual memory can greatly reduce the usable lifespan of the mass storage 521.

In contrast to virtual memory, virtual memory compression (e.g., the Linux® kernel feature "ZRAM") uses part of the memory as compressed block storage to avoid paging to the mass storage 521. Paging takes place in the compressed block until it is necessary to write such data to the mass storage 521. Virtual memory compression increases the usable size of memory 504, while reducing wear on the mass storage 521.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, and the like. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 524 can further be transmitted or received over a communications network 526 using a transmission medium via the network interface device 520 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®). IEEE 802.15.4 family of standards, peer-to-peer (P2P) networks, among others. In an example, the network interface device 520 can include one or more physical jacks (e.g., Ethernet, coaxial, or phone jacks) or one or more antennas to connect to the communications network 526. In an example, the network interface device 520 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 500, and includes digital or analog communications signals or other intangible medium to facilitate communication of such software.

ADDITIONAL EXAMPLES

Example 1 is a memory package for a storage backed memory package save trigger, the memory package comprising: a volatile portion to store data; a non-volatile portion; a first interface to: receive the data; and receive a reset signal; a second interface arranged to connect to a host; and a processing device to save the data stored in the volatile portion to the non-volatile portion in response to the reset signal.

In Example 2, the subject matter of Example 1 includes, wherein the second interface is a bus that operates in accordance with an I2C family of standards.

In Example 3, the subject matter of Examples 1-2 includes, wherein the first interface is a version four double data rate (DDR4) random-access memory (RAM) interface.

In Example 4, the subject matter of Example 3 includes, wherein the memory package conforms to a non-volatile dual in-line memory module (NVDIMM).

In Example 5, the subject matter of Example 4 includes, wherein the NVDIMM is a NVDIMM-N type in accordance with a Joint Electron Device Engineering Council (JEDEC) family of standards.

In Example 6, the subject matter of Examples 3-5 includes, wherein the reset signal is received at pin corresponding to RESET_n as defined in a Joint Electron Device Engineering Council (JEDEC) family of standards for DDR4.

In Example 7, the subject matter of Examples 3-6 includes, wherein the processing device is arranged to save the data stored in the volatile portion to the non-volatile portion in response to a determination that a dedicated save signal is inoperative.

In Example 8, the subject matter of Example 7 includes, wherein the pin corresponding to RESET_n is pin 94 of 288.

In Example 9, the subject matter of Examples 7-8 includes, wherein the dedicated save signal is communicated by a pin corresponding to SAVE_n as defined in a Joint Electron Device Engineering Council (JEDEC) family of standards for DDR4.

In Example 10, the subject matter of Example 9 includes, wherein the pin corresponding to SAVE_n is pin 230 of 288.

In Example 11, the subject matter of Examples 3-10 includes, wherein the processing device is arranged to save the data stored in the volatile portion to the non-volatile portion in response to a self-refresh mode of the memory package being enabled at the time of the reset signal.

In Example 12, the subject matter of Examples 1-11 includes, wherein the memory package operates in accordance with a Joint Electron Device Engineering Council (JEDEC) Byte Addressable Energy Backed Interface (BAEBI) family of standards.

In Example 13, the subject matter of Example 12 includes, wherein the JEDEC BAEBI family of standards include a JESD245B.01 standard.

Example 14 is a method for a storage backed memory package save trigger, the method comprising: receiving data via a first interface to store in a volatile portion of the memory package, the memory package including a second interface arranged to connect a host to a processing device in the memory package; receiving a reset signal at the memory package via the first interface; and saving the data stored in the volatile portion of the memory package to a non-volatile portion of the memory package in response to the reset signal.

In Example 15, the subject matter of Example 14 includes, wherein the second interface is a bus that operates in accordance with an I2C family of standards.

In Example 16, the subject matter of Examples 14-15 includes, wherein the first interface is a version four double data rate (DDR4) random-access memory (RAM) interface.

In Example 17, the subject matter of Example 16 includes, wherein the memory package conforms to a non-volatile dual in-line memory module (NVDIMM).

In Example 18, the subject matter of Example 17 includes, wherein the NVDIMM is a NVDIMM-N type in accordance with a Joint Electron Device Engineering Council (JEDEC) family of standards.

In Example 19, the subject matter of Examples 16-18 includes, wherein the reset signal is received at pin corresponding to RESET_n as defined in a Joint Electron Device Engineering Council (JEDEC) family of standards for DDR4.

In Example 20, the subject matter of Examples 16-19 includes, wherein saving the data stored in the volatile portion of the memory package to the non-volatile portion of the memory package is performed in response to a determination that a dedicated save signal is inoperative.

In Example 21, the subject matter of Example 20 includes, wherein the pin corresponding to RESET_n is pin 94 of 288.

In Example 22, the subject matter of Examples 20-21 includes, wherein the dedicated save signal is communicated by a pin corresponding to SAVE_n as defined in a Joint Electron Device Engineering Council (JEDEC) family of standards for DDR4.

In Example 23, the subject matter of Example 22 includes, wherein the pin corresponding to SAVE_n is pin 230 of 288.

In Example 24, the subject matter of Examples 16-23 includes, wherein saving the data stored in the volatile portion of the memory package to the non-volatile portion of the memory package is performed in response to a self-refresh mode of the memory package being enabled at the time of the reset signal.

In Example 25, the subject matter of Examples 14-24 includes, wherein the memory package operates in accordance with a Joint Electron Device Engineering Council (JEDEC) Byte Addressable Energy Backed Interface (BAEBI) family of standards.

In Example 26, the subject matter of Example 25 includes, wherein the JEDEC BAEBI family of standards include a JESD245B.01 standard.

Example 27 is at least one machine readable medium including instructions for a storage backed memory package save trigger, the instructions, when executed by processing circuitry of the memory package, cause the memory package to perform operations comprising: receiving data via a first interface to store in a volatile portion of the memory package, the memory package including a second interface arranged to connect a host to a processing device in the memory package; receiving a reset signal at the memory package via the first interface; and saving the data stored in the volatile portion of the memory package to a non-volatile portion of the memory package in response to the reset signal.

In Example 28, the subject matter of Example 27 includes, wherein the second interface is a bus that operates in accordance with an I2C family of standards.

In Example 29, the subject matter of Examples 27-28 includes, wherein the first interface is a version four double data rate (DDR4) random-access memory (RAM) interface.

In Example 30, the subject matter of Example 29 includes, wherein the memory package conforms to a non-volatile dual in-line memory module (NVDIMM).

In Example 31, the subject matter of Example 30 includes, wherein the NVDIMM is a NVDIMM-N type in accordance with a Joint Electron Device Engineering Council (JEDEC) family of standards.

In Example 32, the subject matter of Examples 29-31 includes, wherein the reset signal is received at pin corresponding to RESET_n as defined in a Joint Electron Device Engineering Council (JEDEC) family of standards for DDR4.

In Example 33, the subject matter of Examples 29-32 includes, wherein saving the data stored in the volatile portion of the memory package to the non-volatile portion of the memory package is performed in response to a determination that a dedicated save signal is inoperative.

In Example 34, the subject matter of Example 33 includes, wherein the pin corresponding to RESET_n is pin 94 of 288.

In Example 35, the subject matter of Examples 33-34 includes, wherein the dedicated save signal is communicated by a pin corresponding to SAVE_n as defined in a Joint Electron Device Engineering Council (JEDEC) family of standards for DDR4.

In Example 36, the subject matter of Example 35 includes, wherein the pin corresponding to SAVE_n is pin 230 of 288.

In Example 37, the subject matter of Examples 29-36 includes, wherein saving the data stored in the volatile portion of the memory package to the non-volatile portion of the memory package is performed in response to a self-refresh mode of the memory package being enabled at the time of the reset signal.

In Example 38, the subject matter of Examples 27-37 includes, wherein the memory package operates in accordance with a Joint Electron Device Engineering Council (JEDEC) Byte Addressable Energy Backed Interface (BAEBI) family of standards.

In Example 39, the subject matter of Example 38 includes, wherein the JEDEC BAEBI family of standards include a JESD245B.01 standard.

Example 40 is a system for a storage backed memory package save trigger, the system comprising: means for receiving data via a first interface to store in a volatile portion of the memory package, the memory package including a second interface arranged to connect a host to a processing device in the memory package; means for receiving a reset signal at the memory package via the first interface; and means for saving the data stored in the volatile portion of the memory package to a non-volatile portion of the memory package in response to the reset signal.

In Example 41, the subject matter of Example 40 includes, wherein the second interface is a bus that operates in accordance with an I2C family of standards.

In Example 42, the subject matter of Examples 40-41 includes, wherein the first interface is a version four double data rate (DDR4) random-access memory (RAM) interface.

In Example 43, the subject matter of Example 42 includes, wherein the memory package conforms to a non-volatile dual in-line memory module (NVDIMM).

In Example 44, the subject matter of Example 43 includes, wherein the NVDIMM is a NVDIMM-N type in accordance with a Joint Electron Device Engineering Council (JEDEC) family of standards.

In Example 45, the subject matter of Examples 42-44 includes, wherein the reset signal is received at pin corresponding to RESET_n as defined in a Joint Electron Device Engineering Council (JEDEC) family of standards for DDR4.

In Example 46, the subject matter of Examples 42-45 includes, wherein saving the data stored in the volatile portion of the memory package to the non-volatile portion of the memory package is performed in response to a determination that a dedicated save signal is inoperative.

In Example 47, the subject matter of Example 46 includes, wherein the pin corresponding to RESET_n is pin 94 of 288.

In Example 48, the subject matter of Examples 46-47 includes, wherein the dedicated save signal is communicated by a pin corresponding to SAVE_n as defined in a Joint Electron Device Engineering Council (JEDEC) family of standards for DDR4.

In Example 49, the subject matter of Example 48 includes, wherein the pin corresponding to SAVE_n is pin 230 of 288.

In Example 50, the subject matter of Examples 42-49 includes, wherein saving the data stored in the volatile portion of the memory package to the non-volatile portion of the memory package is performed in response to a self-refresh mode of the memory package being enabled at the time of the reset signal.

In Example 51, the subject matter of Examples 40-50 includes, wherein the memory package operates in accordance with a Joint Electron Device Engineering Council (JEDEC) Byte Addressable Energy Backed Interface (BAEBI) family of standards.

In Example 52, the subject matter of Example 51 includes, wherein the JEDEC BAEBI family of standards include a JESD245B.01 standard.

Example 53 is at least one machine-readable medium including instructions that, when executed by processing circuitry, cause the processing circuitry to perform operations to implement of any of Examples 1-52.

Example 54 is an apparatus comprising means to implement of any of Examples 1-52.

Example 55 is a system to implement of any of Examples 1-52.

Example 56 is a method to implement of any of Examples 1-52.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell can be programmed to an erased state).

It will be understood that when an element is referred to as being "on," "connected to," or "coupled with" another element, it can be directly on, connected, or coupled with the other element or intervening elements can be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A memory package, the memory package comprising:
a volatile portion arranged to store data;
a non-volatile portion;
a first interface arranged to:
receive the data; and
receive a reset signal;
a second interface arranged to connect to a host; and
a processing device arranged to save the data stored in the volatile portion to the non-volatile portion in response to a determination that a dedicated save signal is inoperative.

2. The memory package of claim 1, wherein the first interface comprises a version four double data rate (DDR4) random-access memory (RAM) interface.

3. The memory package of claim 2, wherein the dedicated save signal is communicated by a pin corresponding to SAVE_n as defined in a Joint Electron Device Engineering Council (JEDEC) family of standards for version four double data rate (DDR4).

4. The memory package of claim 1, wherein the second interface is a bus that operates in accordance with an Inter-Integrated Circuit (I2C) family of standards.

5. The memory package of claim 1, wherein the processing device is further arranged to save the data stored in the volatile portion to the non-volatile portion in response to a self-refresh mode of the memory package being enabled at a time of the reset signal.

6. A method comprising:
receiving data via a first interface to store in a volatile portion of a memory package, the first interface being arranged to receive a reset signal, the memory package including a second interface arranged to connect a host to a processing device in the memory package;
determining whether a dedicated save signal is inoperative; and
saving the data stored in the volatile portion of the memory package to a non-volatile portion of the memory package in response to determining that the dedicated save signal is inoperative.

7. The method of claim 6, wherein the first interface comprises a version four double data rate (DDR4) random-access memory (RAM) interface.

8. The method of claim 7, wherein the dedicated save signal is communicated by a pin corresponding to SAVE_n as defined in a Joint Electron Device Engineering Council (JEDEC) family of standards for version four double data rate (DDR4).

9. The method of claim 6, wherein the second interface is a bus that operates in accordance with an Inter-Integrated Circuit (I2C) family of standards.

10. The method of claim 6, further comprising:
saving the data stored in the volatile portion to the non-volatile portion in response to a self-refresh mode of the memory package being enabled at a time of the reset signal.

11. At least one non-transitory machine readable medium including instructions, the instructions, when executed by processing circuitry of a memory package, cause the memory package to perform operations comprising:
receiving data via a first interface to store in a volatile portion of the memory package, the first interface being arranged to receive a reset signal, the memory package including a second interface arranged to connect a host to a processing device in the memory package;
determining whether a dedicated save signal is inoperative; and
saving the data stored in the volatile portion of the memory package to a non-volatile portion of the memory package in response to determining that the dedicated save signal is inoperative.

12. The at least one non-transitory machine readable medium of claim 11, wherein the first interface comprises a version four double data rate (DDR4) random-access memory (RAM) interface.

13. The at least one non-transitory machine readable medium of claim 12, wherein the dedicated save signal is communicated by a pin corresponding to SAVE_n as defined in a Joint Electron Device Engineering Council (JEDEC) family of standards for version four double data rate (DDR4).

14. The at least one non-transitory machine readable medium of claim 11, wherein the second interface is a bus that operates in accordance with an Inter-Integrated Circuit (I2C) family of standards.

15. The at least one non-transitory machine readable medium of claim 11, wherein the operations further comprise:
 saving the data stored in the volatile portion to the non-volatile portion in response to a self-refresh mode of the memory package being enabled at a time of the reset signal.

* * * * *